United States Patent
Ahn et al.

(10) Patent No.: US 10,242,804 B2
(45) Date of Patent: *Mar. 26, 2019

(54) MULTILAYER CERAMIC CAPACITOR AND MOUNTING BOARD THEREFOR

(71) Applicant: SAMSUNG ELECTRO-MECHANICS CO., LTD., Suwon-si, Gyeonggi-do (KR)

(72) Inventors: Young Ghyu Ahn, Suwon-si (KR); Doo Young Kim, Suwon-si (KR); Min Cheol Park, Suwon-si (KR); Byoung Hwa Lee, Suwon-si (KR); Sang Soo Park, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/870,163

(22) Filed: Jan. 12, 2018

(65) Prior Publication Data

US 2018/0233288 A1 Aug. 16, 2018

Related U.S. Application Data

(60) Continuation of application No. 15/340,613, filed on Nov. 1, 2016, now Pat. No. 9,978,522, which is a (Continued)

(30) Foreign Application Priority Data

Jan. 2, 2013 (KR) .................. 10-2013-0000176

(51) Int. Cl.
*H01G 4/30* (2006.01)
*H01G 2/06* (2006.01)
(Continued)

(52) U.S. Cl.
CPC ............. *H01G 4/30* (2013.01); *H01G 2/06* (2013.01); *H01G 2/065* (2013.01); *H01G 4/232* (2013.01);
(Continued)

(58) Field of Classification Search
CPC ...................................... H01G 4/30
See application file for complete search history.

(56) References Cited

U.S. PATENT DOCUMENTS 6,370,015 B2 4/2002 Noda et al.
7,551,422 B2 6/2009 Togashi
(Continued)

FOREIGN PATENT DOCUMENTS

CN 1591718 A 3/2005
CN 101034620 A 9/2007
(Continued)

OTHER PUBLICATIONS

Notice of Office Action Japanese Patent Application No. 2013-146282 dated Jan. 21, 2014 with English translation.
(Continued)

*Primary Examiner* — Eric W Thomas
(74) *Attorney, Agent, or Firm* — Morgan Lewis & Bockius LLP

(57) ABSTRACT

A multilayer ceramic capacitor includes: a ceramic body having dielectric layers laminated in a thickness direction, the dielectric layers having a greater width than a length; an active layer in which capacitance is formed, by including first and second internal electrodes alternately exposed to end surfaces of the ceramic body opposite to each other in a length direction with the dielectric layer interposed therebetween; upper cover layer; lower cover layers being thicker than the upper cover layer; and first and second external electrodes, wherein, when half of thickness of the
(Continued)

ceramic body is denoted by A, thickness of the lower cover layer is denoted by B, half of thickness of the active layer is denoted by C, and thickness of the upper cover layer is denoted by D, $1.042 \leq (B+C)/A \leq 1.537$ is satisfied.

10 Claims, 4 Drawing Sheets

Related U.S. Application Data division of application No. 13/943,528, filed on Jul. 16, 2013.

(51) Int. Cl.
  *H01G 4/232* (2006.01)
  *H01G 4/248* (2006.01)
  *H05K 1/11* (2006.01)
  *H05K 1/18* (2006.01)

(52) U.S. Cl.
  CPC ............ *H01G 4/248* (2013.01); *H05K 1/111* (2013.01); *H05K 1/181* (2013.01); *H05K 2201/10015* (2013.01)

(56) References Cited

U.S. PATENT DOCUMENTS

| | | | |
|---|---|---|---|
| 8,638,543 B2 | 1/2014 | Ahn et al. | |
| 8,947,850 B2 | 2/2015 | Togashi | |
| 9,978,522 B2 * | 5/2018 | Ahn | H01G 4/30 |
| 2005/0046516 A1 | 3/2005 | Togashi | |
| 2007/0211404 A1 | 9/2007 | Kojima et al. | |
| 2007/0247783 A1 | 10/2007 | Shimizu et al. | |
| 2008/0080120 A1 | 4/2008 | Togashi | |
| 2008/0100987 A1 | 5/2008 | Togashi | |
| 2008/0100988 A1 | 5/2008 | Togashi | |
| 2008/0106847 A1 | 5/2008 | Ota | |
| 2008/0144253 A1 | 6/2008 | Togashi | |
| 2008/0174935 A1 | 7/2008 | Togashi et al. | |
| 2009/0207553 A1 | 8/2009 | Togashi | |
| 2011/0013341 A1 | 1/2011 | Park et al. | |
| 2012/0300361 A1 | 11/2012 | Togashi | |
| 2014/0153155 A1 | 6/2014 | Fujii et al. | |

FOREIGN PATENT DOCUMENTS

| | | |
|---|---|---|
| CN | 101055802 A | 10/2007 |
| CN | 101140825 A | 3/2008 |
| CN | 101162648 A | 4/2008 |
| CN | 101178978 A | 5/2008 |
| CN | 101206952 A | 6/2008 |
| CN | 101231909 A | 7/2008 |
| CN | 101236837 A | 8/2008 |
| CN | 101510463 A | 8/2009 |
| JP | 06-215978 A | 8/1994 |
| JP | 8-130160 A | 5/1996 |
| JP | 09-148174 A | 6/1997 |
| JP | 4396682 B | 10/2009 |
| JP | 2011-134875 A | 7/2011 |
| JP | 2012-248581 A | 12/2012 |

OTHER PUBLICATIONS

Office Action Korean Patent Application No. 10-2013-0000176 dated Apr. 9, 2014 with English translation.
U.S. Office Action issued in U.S. Appl. No. 13/943,528, dated Apr. 15, 2015.
U.S. Office Action issued in U.S. Appl. No. 13/943,528, dated Aug. 4, 2015.
U.S. Office Action issued in U.S. Appl. No. 13/943,528, dated Dec. 17, 2015.
U.S. Office Action issued in U.S. Appl. No. 13/943,528, dated Apr. 4, 2016.
U.S. Office Action issued in U.S. Appl. No. 13/943,528, dated Sep. 13, 2016.
Chinese Office Action dated Oct. 26, 2016 issued in Chinese Patent Application No. 201310334606.4 (with English translation).
Decision of Rejecion issued in corresponding Chinese Patent Application No. 201310334606.4 dated May 16, 2017, with English language translation.
Office Action issued in U.S. Appl. No. 15/340,613, dated Feb. 24, 2017.
Final Office Action issued in U.S. Appl. No. 15/340,613, dated Sep. 12, 2017.

\* cited by examiner

MULTILAYER CERAMIC CAPACITOR AND MOUNTING BOARD THEREFOR

CROSS-REFERENCE TO RELATED APPLICATIONS

This application is a Continuation of U.S. application Ser. No. 15/340,613, filed Nov. 1, 2016, which is a Divisional of U.S. application Ser. No. 13/943,528, filed on Jul. 16, 2013, which claims priority to Korean Patent Application No. 10-2013-0000176 filed on Jan. 2, 2013, the disclosures of which are incorporated herein by reference.

BACKGROUND OF THE INVENTION

Field of the Invention

The present invention relates to a multilayer ceramic capacitor and a mounting board having a multilayer ceramic capacitor mounted thereon.

Description of the Related Art

A multilayer ceramic capacitor, a multilayer chip electronic component, is a chip type condenser commonly mounted on printed circuit boards of various electronic products, such as image display devices including a liquid crystal display (LCD), a plasma display panel (PDP) and the like, a computer, a personal digital assistant (PDA), a mobile phone, and the like, and provided for the charging or discharging of electricity.

Multilayer ceramic capacitors (MLCCs) may be used as components of various electronic products due to having the advantages of a small size, high capacitance, and ease of mounting.

The multilayer ceramic capacitor may have a structure in which a plurality of dielectric layers and a plurality of internal electrodes having different polarities and provided between the dielectric layers are alternately laminated with each other.

However, since these dielectric layers have piezoelectricity properties and electrostrictive properties, a piezoelectric phenomenon may occur and thus cause vibrations among the internal electrodes when AC or DC voltage is applied to the multilayer ceramic capacitor.

Such vibrations may be transferred to a printed circuit board on which the multilayer ceramic capacitor is mounted, through external electrodes of the multilayer ceramic capacitor, and the entire printed circuit board may become an acoustic reflection surface, generating vibrating sound as noise.

The vibrating sound may correspond to an audible frequency range of 20 to 20000 Hz, a frequency which may cause listener discomfort and which is known as acoustic noise. Studies into the reduction of such acoustic noise are needed.

Patent Document 1 below discloses a multilayer ceramic capacitor in which a lower cover layer has a greater thickness than an upper cover layer and external electrodes are formed on both end surfaces of the ceramic body.

RELATED ART DOCUMENT (Patent Document 1) Japanese Patent Laid-Open Publication No. H06-215978

SUMMARY OF THE INVENTION

An aspect of the present invention provides a multilayer ceramic capacitor capable of reducing noise generated due to vibrations caused by a piezoelectric effect.

According to an aspect of the present invention, there is provided a multilayer ceramic capacitor, including: a ceramic body having a plurality of dielectric layers laminated in a thickness direction thereof, the plurality of dielectric layers having a greater width than a length; an active layer in which capacitance is formed, by including a plurality of first and second internal electrodes laminated in the thickness direction so as to be alternately exposed to both end surfaces of the ceramic body opposite to each other in a length direction of the ceramic body while having the dielectric layer interposed therebetween; an upper cover layer formed above the active layer; a lower cover layer formed below the active layer, the lower cover layer having a greater thickness than the upper cover layer; and first and second external electrodes covering the both end surfaces of the ceramic body, wherein, when half of an overall thickness of the ceramic body is denoted by A, a thickness of the lower cover layer is denoted by B, half of an overall thickness of the active layer is denoted by C, and a thickness of the upper cover layer is denoted by D, a ratio of deviation of a center of the active layer from a center of the ceramic body, $(B+C)/A$, satisfies $1.042 \leq (B+C)/A \leq 1.537$.

Here, a ratio of the thickness D of the upper cover layer to the thickness B of the lower cover layer, $D/B$, may satisfy $0.048 \leq D/B \leq 0.565$.

Here, a ratio of the thickness B of the lower cover layer to half A of the overall thickness of the ceramic body, $B/A$, may satisfy $0.601 \leq B/A \leq 1.128$.

Here, a ratio of half C of the overall thickness of the active layer to the thickness B of the lower cover layer, $C/B$, may satisfy $0.362 \leq C/B \leq 1.092$.

Here, a point of inflection formed on the both end surfaces of the ceramic body may be formed at a height equal to that of a center of the thickness of the ceramic body or therebelow, due to a difference between a deformation rate occurring in the center of the active layer and a deformation rate occurring in the lower cover layer when voltage is applied thereto.

According to another aspect of the present invention, there is provided a mounting board for a multilayer ceramic capacitor, the mounting board including: a printed circuit board having first and second electrode pads formed thereon; and a multilayer ceramic capacitor mounted on the printed circuit board, wherein the multilayer ceramic capacitor includes a ceramic body having a plurality of dielectric layers in a thickness direction thereof, the dielectric layer having a greater width than a length; an active layer in which capacitance is formed, by including a plurality of first and second internal electrodes laminated in the thickness direction so as to be alternately exposed to both end surfaces of the ceramic body opposite to each other in a length direction of the ceramic body while having the dielectric layer interposed therebetween; an upper cover layer formed above the active layer; a lower cover layer formed below the active layer, the lower cover layer having a greater thickness than the upper cover layer; and first and second external electrodes covering the both end surfaces of the ceramic body and connected to the first and second electrode pads through a soldering, when half of an overall thickness of the ceramic body is denoted by A, a thickness of the lower cover layer is denoted by B, half of an overall thickness of the active layer is denoted by C, and a thickness of the upper cover layer is denoted by D, a ratio of deviation of a center of the active layer from a center of the ceramic body, (B+C)/A, satisfies 1.042≤(B+C)/A≤1.537.

Here, a point of inflection formed on the both end surfaces of the ceramic body may be formed at a height equal to that of the soldering or therebelow, due to a difference between a deformation rate occurring in the center of the active layer and a deformation rate occurring in the lower cover layer when voltage is applied thereto.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
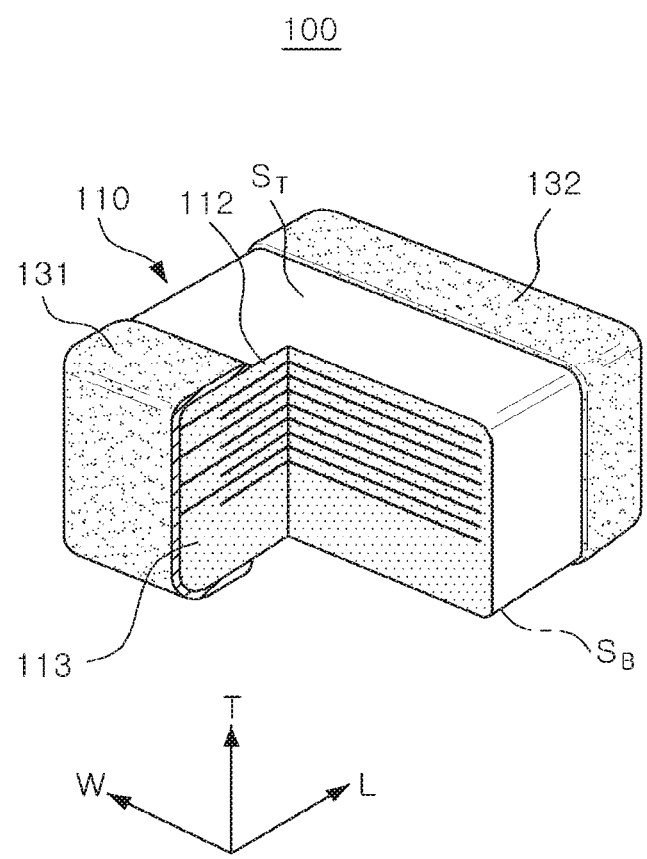
FIG. 1 is a perspective view schematically showing a multilayer ceramic capacitor according to an embodiment of the present invention of which a portion thereof is cut.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

When directions of a hexahedron are defined in order to clearly describe embodiments of the present invention, L, W, and T shown in the drawings indicate length, width, and thickness directions, respectively. Here, the width direction may also refer to a lamination direction in which dielectric layers are laminated.

In addition, in the embodiments of the present invention, for convenience of explanation, surfaces of a ceramic body on which first and second external electrodes are formed in a length direction of a ceramic body are defined as both end surfaces, and surfaces of the ceramic body perpendicular to the end surfaces are defined as side surfaces.

Multilayer Ceramic Capacitor

Figure 2:
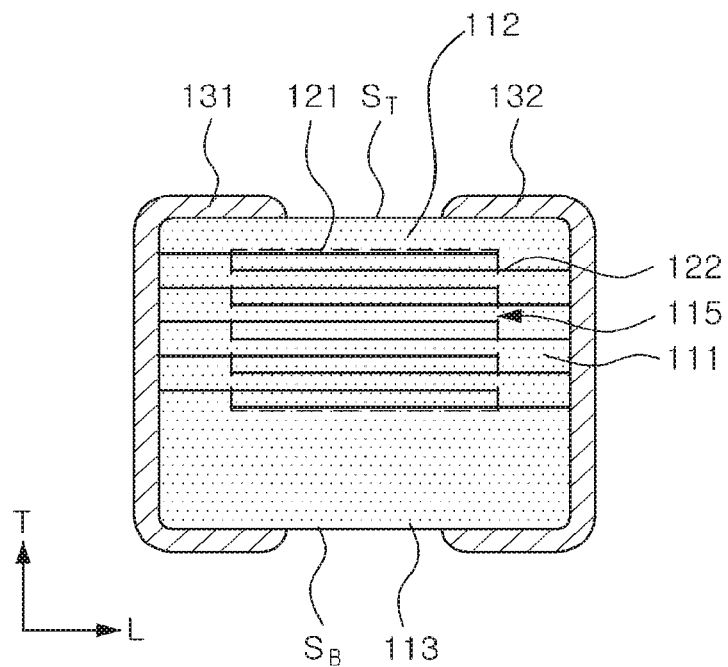
FIG. 2 is a cross-sectional view showing the multilayer ceramic capacitor of FIG. 1, cut in a length direction thereof.

Referring to FIGS. 1 and 2, a multilayer ceramic capacitor 100 according to an embodiment of the present invention may include a ceramic body 110 having a greater width than a length thereof, an active layer 115 including first and second internal electrodes 121 and 122, upper and lower cover layers 112 and 113, and first and second external electrodes 131 and 132 covering both end surfaces of the ceramic body 110 opposite to each other in a length direction thereof.

The ceramic body 110 may be formed by laminating a plurality of dielectric layers 111 in a thickness direction and then sintering them, the dielectric layer 111 having a greater width than a length thereof. Here, a ratio between length and width may be about 1:2, and the shape and dimension of the ceramic body 110 and the number of dielectric layers 111 are not limited to those exemplified in the present embodiment.

The plurality of dielectric layers 111 forming the ceramic body 110 are in a sintered state, and boundaries between adjacent dielectric layers 111 may be integrated such that they may not be readily discernible without a scanning electron microscope (SEM).

The ceramic body 110 may include the active layer 115 contributing to capacitance formation of the multilayer ceramic capacitor and the upper and lower cover layers 112 and 113 formed above and below the active layer 115 as upper and lower margin parts, respectively.

The active layer 115 may be formed by repeatedly laminating the plurality of first and second internal electrodes 121 and 122 with the dielectric layers 111 interposed therebetween.

Here, a thickness of the dielectric layer 111 may be optionally changed according to desired capacitance of the multilayer ceramic capacitor 100, and the thickness of a single dielectric layer may be 0.01 to 1.00 μm after sintering, but the present invention is not limited thereto.

In addition, the dielectric layer 111 may contain a ceramic powder having high dielectric permittivity, for example, a barium titanate ($BaTiO_3$) based powder or a strontium titanate ($SrTiO_3$) based powder, but the present invention is not limited thereto.

The upper and lower cover layers 112 and 113 may have the same material and constitution as the dielectric layers 111, except that they do not include the internal electrodes.

The upper and lower cover layers 112 and 113 may be formed by laminating a single dielectric layer or two or more dielectric layers on upper and lower surfaces of the active layer 115 in the thickness direction, respectively. The upper and lower cover layers 112 and 113 may basically serve to prevent damages to the first and second internal electrodes 121 and 122 due to physical or chemical stress.

Here, the lower cover layer 113 may have a greater thickness than the upper cover layer 112 by further increasing the number of dielectric layers laminated therein when compared with the upper cover layer 112.

The first and second internal electrodes 121 and 122 are pairs of electrodes having opposite polarities. The first and second internal electrodes 121 and 122 may be formed by printing a predetermined thickness of conductive paste containing a conductive metal on the dielectric layers 111. Here, the first and second internal electrodes 121 and 122 may be alternately exposed to both end surfaces of the ceramic body 110 and may be electrically insulated from each other by the dielectric layers 111 disposed therebetween.

That is, the first and second internal electrodes 121 and 122 may be electrically connected to the first and second external electrodes 131 and 132 through portions thereof alternately exposed to both end surfaces of the ceramic body 110.

Therefore, when voltages are applied to the first and second external electrodes 131 and 132, charges are stored between the first and second internal electrodes 121 and 122 opposite to each other. Here, the capacitance of the multilayer ceramic capacitor 100 is proportional to an area of an overlap portion of the first and second internal electrodes 121 and 122.

The thickness of the first and second internal electrodes 121 and 122 may be determined depending on use thereof, and for example, may be determined within a range of 0.2 to 1.0 μm in consideration of the size of the ceramic body 110. However, the present invention is not limited thereto.

In addition, a conductive metal contained in the conductive paste for forming the first and second internal electrodes 121 and 122 may be nickel (Ni), copper (Cu), palladium (Pd), or an alloy thereof, but the present invention is not limited thereto.

In addition, the conductive paste may be printed by a screen printing method, a gravure printing method, or the like, but the present invention is not limited thereto.

The first and second external electrodes 131 and 132 may be formed of a conductive paste containing a conductive metal. The conductive metal contained in the conductive paste may be nickel (Ni), copper (Cu), palladium (Pd), gold (Au), or an alloy thereof, but the present invention is not limited thereto.

Hereinafter, a relationship between dimensions of elements included in the multilayer ceramic capacitor according to the present embodiment and acoustic noise will be described.

Figure 3:
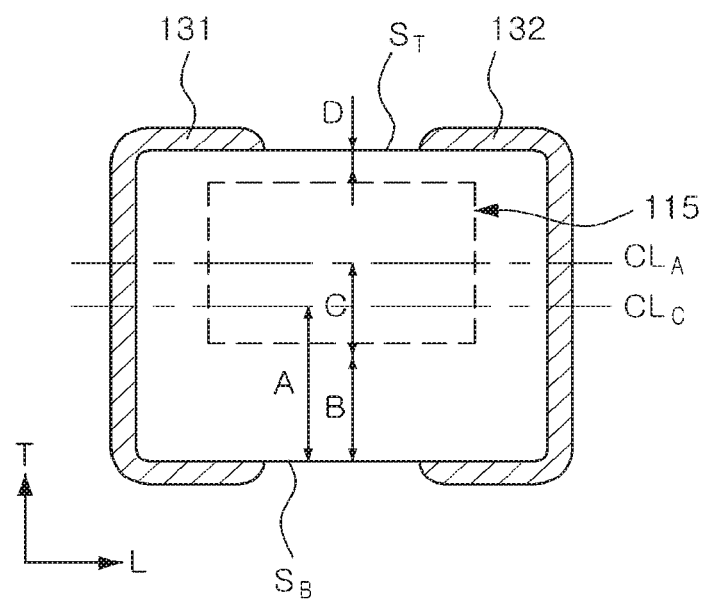
FIG. 3 is a cross-sectional view schematically showing the multilayer ceramic capacitor of FIG. 1, cut in the length direction thereof, to illustrate dimensional relationships among elements included in the multilayer ceramic capacitor.

Referring to FIG. 3, A denotes half of an overall thickness of the ceramic body 110, B denotes a thickness of the lower cover layer 113, C denotes half of an overall thickness of the active layer 115, and D denotes a thickness of the upper cover layer 112.

Here, the overall thickness of the ceramic body 110 refers to a distance from a top surface $S_T$ to a bottom surface $S_B$ of the ceramic body 110. The overall thickness of the active layer 115 refers to a distance from an upper surface of the first internal electrode 121 located at the uppermost portion of the active layer 115 to a lower surface of the second internal electrode 122 located at the lowermost portion of the active layer 115.

In addition, the thickness B of the lower cover layer 113 refers to a distance from a lower surface of the second internal electrode 122 located at the lowermost portion of the active layer 115 in the thickness direction to the bottom surface $S_B$ of the ceramic body 110, and the thickness D of the upper cover layer 112 refers to a distance from an upper surface of the first internal electrode 121 located at the uppermost portion of the active layer 115 in the thickness direction to the top surface $S_T$ of the ceramic body 110.

When voltages having opposite polarities are applied to the first and second external electrodes 131 and 132 formed on both end surfaces of the multilayer ceramic capacitor 100, the ceramic body 110 expands and contracts in the thickness direction thereof due to an inverse piezoelectric effect occurring in the dielectric layers 111, and the first and second external electrodes 131 and 132 contract and expand, contrary to expansion and contraction in the thickness direction of the ceramic body 110, due to the Poisson effect.

Here, a center of the active layer 115 refers to maximally expanded portions of the first and second external electrodes 131 and 132 in the length direction, which becomes a factor in the generation of acoustic noise.

That is, in the present embodiment of the invention, in order to reduce acoustic noise, a point of inflection (PI) formed on both end surfaces of the ceramic body 110 may be formed at a height equal to that of a center $CL_C$ of the ceramic body in the thickness direction 110 or therebelow, due to a difference between a deformation rate occurring in a center $CL_A$ of the active layer 115 and a deformation rate occurring in the lower cover layer 113 when the voltages are applied thereto.

Here, in order to further reduce acoustic noise, a ratio of deviation of the center $CL_A$ of the active layer 115 from the center $CL_C$ of the ceramic body 110, (B+C)/A, may satisfy $1.042 \leq (B+C)/A \leq 1.537$.

In addition, a ratio of the thickness D of the upper cover layer 112 to the thickness B of the lower cover layer 113, D/B, may satisfy $0.048 \leq D/B \leq 0.565$.

In addition, a ratio of the thickness B of the lower cover layer 113 to half A of the overall thickness of the ceramic body 110, B/A, may satisfy $0.601 \leq B/A \leq 1.128$.

In addition, a ratio of half C of the overall thickness of the active layer 115 to the thickness B of the lower cover layer 113, C/B, may satisfy $0.362 \leq C/B \leq 1.092$.

EXPERIMENTAL EXAMPLES

Individual multilayer ceramic capacitors according to inventive and comparative examples were manufactured as follows.

A slurry including a barium titanate ($BaTiO_3$) powder or the like was coated on carrier films and dried, to prepare a plurality of ceramic green sheets having a thickness of 1.8 μm while the ceramic green sheet has a greater width than a length thereof.

Then, a conductive paste was coated on the plurality of green sheets by using a screen printing method, to form the plurality of first and second internal electrodes 121 and 122, alternately exposed to both end surfaces of the ceramic green sheets opposite to each other in a length direction.

Then, approximately 370 layers of the ceramic green sheets were laminated to form a laminate. In addition, this laminate was subjected to isostatic pressing at 85° C. under 1000 kgf/cm².

Then, the pressed ceramic laminate was cut into individual chips. Each of the cut chips was subjected to debindering at 230° C. in an atmospheric atmosphere for 60 hours.

Thereafter, the resultant chip was sintered at 1200° C. in a reduction atmosphere under an oxygen partial pressure of $10^{-11}$ atm to $10^{-10}$ atm, lower than an equilibrium oxygen partial pressure of Ni/NiO, so that the first and second internal electrodes 121 and 122 were not oxidized. After sintering, the size of the ceramic body 110 was 0.85 mm×1.67 mm in length×width (L×W, so-called LICC type). Here, a manufacturing tolerance was set within a range of ±0.1 mm in length×width (L×W).

Then, the first and second external electrodes 131 and 132 were formed on both end surfaces of the ceramic body 110, followed by a plating process, to manufacture the multilayer ceramic capacitor 100. Then, acoustic noise was measured through experimentation.

TABLE 1

| Sample | A | B | C | D | (B + C)/A | B/A | D/B | C/B | Acoustic Noise (dB) | Capacitance Implementation Ratio |
|---|---|---|---|---|---|---|---|---|---|---|
| 1* | 247.4 | 28.6 | 218.9 | 28.4 | 1.000 | 0.116 | 0.993 | 7.654 | 32.1 | OK |
| 2* | 258.7 | 28.0 | 219.8 | 49.7 | 0.958 | 0.108 | 1.775 | 7.850 | 31.5 | OK |
| 3* | 265.5 | 27.9 | 218.9 | 65.2 | 0.930 | 0.105 | 2.337 | 7.846 | 32.0 | OK |
| 4* | 283.0 | 28.2 | 217.7 | 102.4 | 0.869 | 0.100 | 3.631 | 7.720 | 31.4 | OK |
| 5* | 330.2 | 27.5 | 217.0 | 198.8 | 0.741 | 0.083 | 7.229 | 7.891 | 31.8 | OK |
| 6* | 381.5 | 27.5 | 217.1 | 301.2 | 0.641 | 0.072 | 10.953 | 7.895 | 32.3 | OK |
| 7 | 257.8 | 50.1 | 218.6 | 28.3 | 1.042 | 0.194 | 0.565 | 4.363 | 25.3 | OK |
| 8 | 265.2 | 65.4 | 218.4 | 28.1 | 1.070 | 0.247 | 0.430 | 3.339 | 23.8 | OK |
| 9 | 283.6 | 101.4 | 218.7 | 28.4 | 1.129 | 0358 | 0.280 | 2.157 | 20.4 | OK |
| 10 | 331.8 | 199.5 | 217.9 | 28.2 | 1.258 | 0.601 | 0.141 | 1.092 | 18.4 | OK |
| 11 | 379.8 | 298.8 | 216.5 | 27.8 | 1.357 | 0.787 | 0.093 | 0.725 | 18.5 | OK |
| 12 | 430.5 | 401.0 | 216.1 | 27.8 | 1.433 | 0.931 | 0.069 | 0.539 | 18.7 | OK |
| 13 | 481.6 | 498.3 | 218.2 | 28.4 | 1.488 | 1.035 | 0.057 | 0.438 | 18.8 | OK |
| 14 | 531.9 | 600.2 | 217.3 | 29.0 | 1.537 | 1.128 | 0.048 | 0.362 | 18.9 | OK |
| 15* | 501.6 | 600.0 | 187.0 | 29.1 | 1.569 | 1.196 | 0.049 | 0.312 | 18.6 | NG |
| 16* | 478.2 | 599.7 | 164.2 | 28.3 | 1.597 | 1.254 | 0.047 | 0.274 | 18.6 | NG |

*Comparative Example

Table 1 shows dimensional data of respective parts, which were measured based on an image obtained by scanning a cross-section of the ceramic body 110 in the length-thickness (L-T) directions cut in a central portion of the ceramic body 110 of the multilayer ceramic capacitor 100 in the width (W) direction thereof, using a scanning electron microscope (SEM), as shown in FIG. 3.

Here, as described above, A was defined as half of the overall thickness of the ceramic body 110, B was defined as the thickness of the lower cover layer 113, C was defined as half of the overall thickness of the active layer 115, and D was defined as the thickness of the upper cover layer 112.

In order to measure acoustic noise, one sample (multilayer ceramic capacitor) per one substrate for acoustic noise measurement was mounted on a printed circuit board 210 while allowing the lower cover layer 113 to be the bottom surface $S_B$, and then the printed circuit board was seated on a measuring jig.

In addition, DC voltage and voltage variation were applied to the first and second external electrodes 131 and 132 of the sample seated on the measuring jig by using a DC power supply and a function generator. In addition, acoustic noise was measured through a microphone installed directly above the printed circuit board 210.

In Table 1, Sample 1 was a comparative example having a symmetrical structure in which the thickness B of the lower cover layer 113 was approximately similar to the thickness D of the upper cover layer 112, and Samples 2 to 6 were comparative examples having a structure in which the thickness D of the upper cover layer 112 (D) was greater than the thickness B of the lower cover layer 113 (B).

In addition, Samples 15 and 16 were comparative examples having a structure in which the thickness B of the lower cover layer 113 was greater than the thickness D of the upper cover layer 112, and Samples 7 to 14 were inventive examples according to the present invention.

Here, in the case in which (B+C)/A was approximately 1, it can be appreciated that the center of the active layer 115 did not significantly deviate from the center of the ceramic body 110. In Sample 1 having the symmetrical structure in which the thickness B of the lower cover layer 113 was approximately similar to the thickness D of the upper cover layer 112, (B+C)/A was approximately 1.

Here, in the case in which (B+C)/A was greater than 1, it can be appreciated that the center of the active layer 115 deviated from the center of the ceramic body 110 upwardly.

Here, in the case in which (B+C)/A was smaller than 1, it can be appreciated that the center of the active region 115 deviated from the center of the ceramic body 110 downwardly.

Referring to Table 1, it may be confirmed that in Samples 7 to 14 (inventive examples) and Samples 15 and 16 (comparative examples) in which the ratio of deviation of the center of the active layer 115 from the center of the ceramic body 110, (B+C)/A, satisfied 1.042≤(B+C)/A, acoustic noise was remarkably reduced to be less than 30 dB.

In addition, in Samples 1 to 6 in which the ratio of deviation of the center of the active layer 115 from the center of the ceramic body 110, (B+C)/A was less than 1.042, the center of the active region 115 scarcely deviated from the center of the ceramic body 110 or the center of the active region 115 deviated from the center of the ceramic body 110 downwardly. It may be seen that acoustic noise in Samples 1 to 6 was higher than 30 dB, which was remarkably high as compared with the inventive examples according to the present invention.

In addition, in Samples 15 and 16 in which the ratio of deviation of the center of the active layer 115 from the center of the ceramic body 110, (B+C)/A, was greater than 1.537, acoustic noise was reduced, but capacitance was excessively lowered as compared with target capacitance, causing defects in capacitance.

In Table 1, in the case in which "Capacitance Implementation Ratio" (that is, a ratio of actual capacitance to target capacitance) is marked by "NG", it means that an actual capacitance value was below 80% when a target capacitance value was 100%.

In addition, it may be seen that, in Samples 7 to 14 in which the ratio of the thickness D of the upper cover layer 112 to the thickness B of the lower cover layer 113, D/B, satisfied 0.048≤D/B≤0.565, acoustic noise was remarkably reduced.

On the other hand, in Samples 1 to 6 in which the ratio of the thickness D of the upper cover layer 112 to the thickness B of the lower cover layer 113, D/B, was greater than 0.565, the effect of reducing acoustic noise was not achieved.

Meanwhile, in Samples 10 to 14 in which the ratio of the thickness B of the lower cover layer 113 to half A of the overall thickness of the ceramic body 110, B/A, and the ratio of half C of the overall thickness of the active layer 115 to the thickness B of the lower cover layer 113, C/B, satisfied $0.601 \leq B/A \leq 1.128$ and $0.362 \leq C/B \leq 1.092$, it may be confirmed that acoustic noise was further reduced to be less than 20 dB.

On the other hand, in Samples 15 and 16 in which the ratio of the thickness B of the lower cover layer 113 to half A of the overall thickness of the ceramic body 110, B/A, was greater than 1.128, or the ratio of half C of the overall thickness of the active layer 115 to the thickness B of the lower cover layer 113, C/B, was less than 0.362, the actual capacitance to the target capacitance was low, resulting in defects in capacitance.

Mounting Board for Multilayer Ceramic Capacitor

Figure 4:
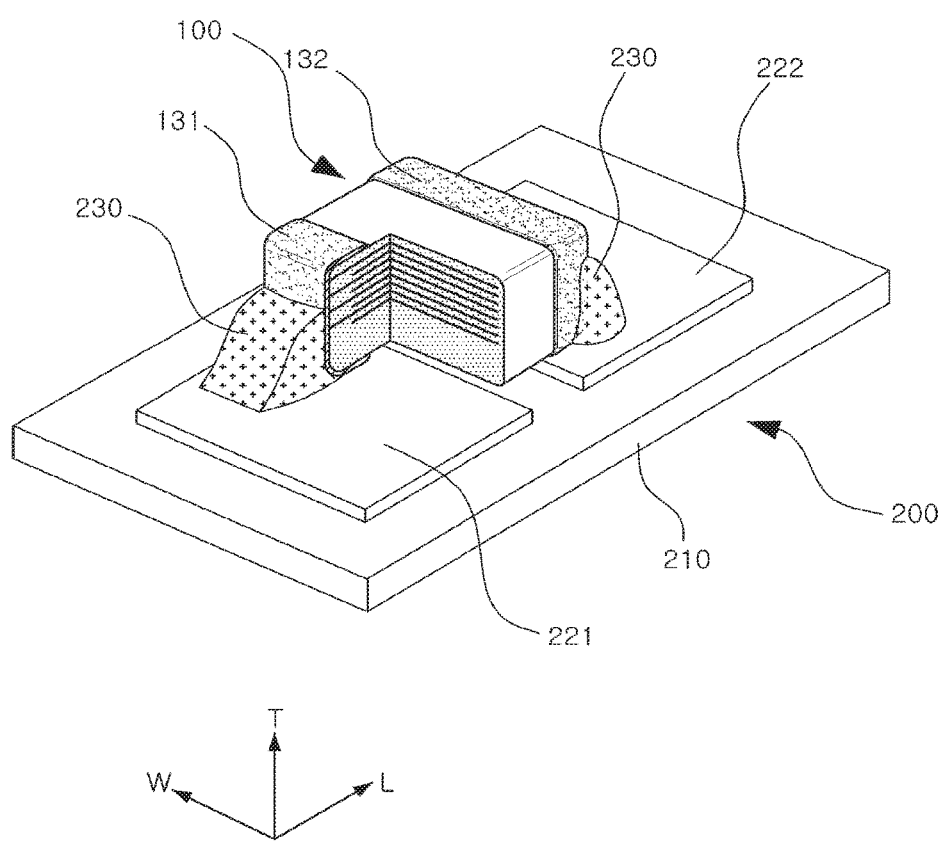
FIG. 4 is a perspective view showing a state in which the multilayer ceramic capacitor of FIG. 1 is mounted on a printed circuit board.
Figure 5:
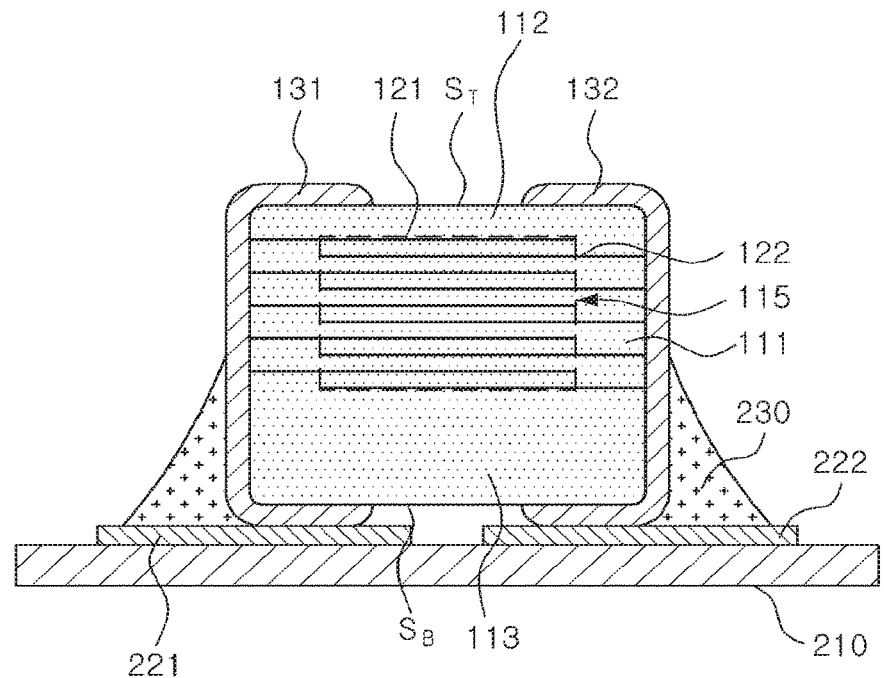
FIG. 5 is a cross-sectional view showing the multilayer ceramic capacitor and the printed circuit board of FIG. 4, cut in the length direction thereof.

Referring to FIGS. 4 and 5, a mounting board 200 for the multilayer ceramic capacitor 100 according to the present embodiment may include a printed circuit board 210 on which the multilayer ceramic capacitor 100 is vertically mounted; and first and second electrode pads 221 and 222 spaced apart from each other on an upper surface of the printed circuit board 210.

Here, the multilayer ceramic capacitor 100 may be electrically connected to the printed circuit board 210 by soldering 230 while the lower cover layer 113 is disposed to form a lower portion of the multilayer ceramic capacitor 100 and the first and second external electrodes 131 and 132 are positioned on and in contact with the first and second electrode pads 221 and 222, respectively.

When voltage is applied in the state in which the multilayer ceramic capacitor 100 is mounted on the printed circuit board 210 as described above, acoustic noise may be generated.

Here, the amount of soldering 230 required to connect the first and second external electrodes 131 and 132 of the multilayer ceramic capacitor 100 to the first and second electrode pads 221 and 222 may be determined according to the size of the first and second electrode pads 221 and 222. In addition, the level of acoustic noise may be controlled according to the amount of soldering 230.

In addition, in the multilayer ceramic capacitor 100 according to the embodiment of the present invention having a greater width than a length, when the multilayer ceramic capacitor 100 is mounted on the printed circuit board 210, vibrations generated by the multilayer ceramic capacitor 100 can be prevented from being transferred, and thus, acoustic noise can be reduced.

Figure 6:
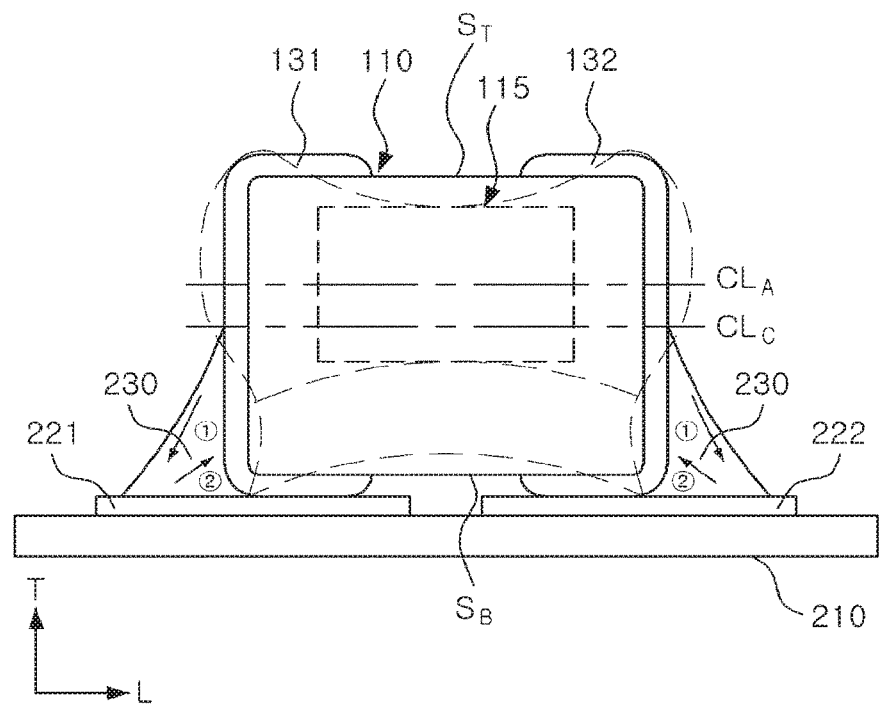
FIG. 6 is a cross-sectional view schematically showing deformation of the multilayer ceramic capacitor of FIG. 4 when voltage is applied thereto in a state in which the multilayer ceramic capacitor is mounted on the printed circuit board.

Referring to FIG. 6, when voltages having opposite polarities are applied to the first and second external electrodes 131 and 132 formed on both end surfaces of the multilayer ceramic capacitor 100 in the state in which the multilayer ceramic capacitor 100 is mounted on the printed circuit board 210, the ceramic body 110 expands and contracts in the thickness direction thereof due to an inverse piezoelectric effect occurring in the dielectric layers 111, and both end portions of the first and second external electrodes 131 and 132 contract and expand, contrary to expansion and contraction in the thickness direction of the ceramic body 110, due to the Poisson effect.

Here, a center of the active layer 115 refers to maximally expanded portions of the first and second external electrodes 131 and 132 in the length direction, which becomes a factor in the generation of acoustic noise.

When both end surfaces of the multilayer ceramic capacitor 100 in the length direction are maximally expanded, outward expansive force ① is generated in an upper portion of the solder 230 by expansion, and contraction force ② is generated in a lower portion of the solder 230 to act on the external electrodes due to the outward expansive force created by the expansion.

Therefore, in the present embodiment, when a point of inflection formed on both end surfaces of the ceramic body 110 is formed at a height equal to that of the soldering 230 or therebelow, due to a difference between a deformation rate occurring in the center $CL_A$ of the active region 115 and a deformation rate occurring in the lower margin part 113 when the voltages are applied thereto, acoustic noise may be further reduced.

As set forth above, in a multilayer ceramic capacitor according to embodiments of the invention, a lower cover layer has a greater thickness than an upper cover layer and external electrodes are formed on both end surfaces of a ceramic body to thereby decrease a length of the ceramic body, so that vibrations generated by the multilayer ceramic capacitor can be prevented from being transferred to a printed circuit board, whereby acoustic noise can be reduced.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor, comprising:
    a ceramic body having a plurality of dielectric layers laminated in a thickness direction thereof;
    an active layer in which capacitance is formed, by including a plurality of first and second internal electrodes laminated in the thickness direction so as to be alternately exposed to both end surfaces of the ceramic body opposite to each other in a length direction of the ceramic body while having the dielectric layer interposed therebetween;
    an upper cover layer formed above the active layer;
    a lower cover layer formed below the active layer; and
    first and second external electrodes covering the both end surfaces of the ceramic body in the length direction of the ceramic body,
    wherein a length of each dielectric layer in the length direction of the ceramic body is less than a width thereof in a width direction of the ceramic body, and
    wherein $1.042 \leq (B+C)/A \leq 1.537$ and $B<A$, in which A is half of an overall thickness of the ceramic body, B is a thickness of the lower cover layer, and C is half of an overall thickness of the active layer.

2. The multilayer ceramic capacitor of claim 1, wherein $0.048 \leq D/B \leq 0.565$ in which D is a thickness of the upper cover layer.

3. The multilayer ceramic capacitor of claim 1, wherein $0.601 \leq B/A < 1.000$.

4. The multilayer ceramic capacitor of claim 1, wherein $0.362 \leq C/B \leq 1.092$.

5. The multilayer ceramic capacitor of claim 1, wherein a point of inflection formed on the both end surfaces of the ceramic body is formed at a height equal to that of a center of the thickness of the ceramic body or therebelow, due to a difference between a deformation rate occurring in the center of the active layer and a deformation rate occurring in the lower cover layer when voltage is applied thereto.

6. A mounting board for a multilayer ceramic capacitor, the mounting board comprising:
    a printed circuit board having first and second electrode pads formed thereon; and
    a multilayer ceramic capacitor mounted on the printed circuit board, wherein the multilayer ceramic capacitor includes:

a ceramic body having a plurality of dielectric layers in a thickness direction thereof;

an active layer in which capacitance is formed, by including a plurality of first and second internal electrodes formed in the thickness direction so as to be alternately exposed to both end surfaces of the ceramic body opposite to each other in a length direction of the ceramic body while having the dielectric layer interposed therebetween;

an upper cover layer formed above the active layer;

a lower cover layer formed below the active layer; and first and second external electrodes covering the both end surfaces of the ceramic body in the length direction of the ceramic body and connected to the first and second electrode pads through a soldering, wherein a length of each dielectric layer in the length direction of the ceramic body is less than a width thereof in a width direction of the ceramic body, and wherein $1.042 \leq (B+C)/A \leq 1.537$ and $B<A$, in which A is half of an overall thickness of the ceramic body, B is a thickness of the lower cover layer, and C is half of an overall thickness of the active layer.

7. The mounting board of claim 6, wherein $0.048 \leq D/B \leq 0.565$ in which D is a thickness of the upper cover layer.

8. The mounting board of claim 6, wherein $0.601 \leq B/A < 1.000$.

9. The mounting board of claim 6, wherein $0.362 \leq C/B \leq 1.092$.

10. The mounting board of claim 6, wherein a point of inflection formed on the both end surfaces of the ceramic body is formed at a height equal to that of the soldering or therebelow, due to a difference between a deformation rate occurring in the center of the active layer and a deformation rate occurring in the lower cover layer when voltage is applied thereto.

* * * * *